United States Patent
Yoo et al.

(10) Patent No.: US 11,104,848 B2
(45) Date of Patent: Aug. 31, 2021

(54) ETCHING SOLUTION FOR SILICON SUBSTRATE AND METHOD FOR MANUFACTURING SEMICONDUCTOR DEVICE USING THE SAME

(71) Applicant: OCI COMPANY LTD., Seoul (KR)

(72) Inventors: Ho-Seong Yoo, Seongnam-si (KR); Myung-Hyun Kim, Seongnam-si (KR); Jun-Eun Lee, Seongnam-si (KR); Pyong-Hwa Jang, Seongnam-si (KR)

(73) Assignee: OCI COMPANY LTD., Seoul (KR)

( * ) Notice: Subject to any disclaimer, the term of this patent is extended or adjusted under 35 U.S.C. 154(b) by 0 days.

(21) Appl. No.: 16/749,193

(22) Filed: Jan. 22, 2020

(65) Prior Publication Data
US 2020/0239771 A1    Jul. 30, 2020

(30) Foreign Application Priority Data

Jan. 28, 2019  (KR) .................. 10-2019-0010297

(51) Int. Cl.
*C08K 13/06*    (2006.01)
*H01L 21/465*   (2006.01)
*C09K 13/06*    (2006.01)

(52) U.S. Cl.
CPC ............ *C09K 13/06* (2013.01); *H01L 21/465* (2013.01)

(58) Field of Classification Search
None
See application file for complete search history.

(56) References Cited

U.S. PATENT DOCUMENTS

2002/0132056 A1* 9/2002 Montano .................. C09D 4/00
427/402

FOREIGN PATENT DOCUMENTS

KR            101778893 B1 *  9/2017

* cited by examiner

*Primary Examiner* — Shamim Ahmed
(74) *Attorney, Agent, or Firm* — Hauptman Ham, LLP

(57) ABSTRACT

Disclosed is an etching solution for a silicon substrate. More specifically, an etching solution for a silicon substrate is disclosed in which a concentration of a silane compound (silicon) in the etching solution for the silicon substrate is adjusted to improve an etching selectivity of a silicon nitride film relative to a silicon oxide film during etching of the nitride film.

10 Claims, No Drawings

ETCHING SOLUTION FOR SILICON SUBSTRATE AND METHOD FOR MANUFACTURING SEMICONDUCTOR DEVICE USING THE SAME

CROSS TO REFERENCE TO RELATED APPLICATIONS

This application claims the priority of Korean Patent Application No. 10-2019-0010297 filed on Jan. 28, 2019, in the Korean Intellectual Property Office, the disclosure of which is hereby incorporated by reference in its entirety.

BACKGROUND

1. Technical Field

The present disclosure relates to an etching solution for a silicon substrate, and a method for manufacturing a semiconductor device using the etching solution. More specifically, the present disclosure relates to an etching solution for a silicon substrate, and a method for manufacturing a semiconductor device using the etching solution, in which an etching selectivity of a silicon nitride film relative to a silicon oxide film while etching the silicon nitride film may be improved by adjusting a concentration of a silane compound (e.g., silicic acid) in the etching solution for the silicon substrate.

2. Description of the Related Art

Currently, there are various methods of etching a silicon nitride film and a silicon oxide film. The methods may mainly include a dry etching method and a wet etching method.

The dry etching method is a gas-based etching method, which has an advantage that the drying etching method is superior to the wet etching method in terms of an isotropy. However, the dry etching method is much inferior to the wet etching method in terms of productivity and economy. Thus, the wet etching method is widely used.

In general, in the wet etching method, a well-known etching solution is a phosphoric acid solution.

In this connection, when only pure phosphoric acid is used for etching the silicon nitride film, not only the silicon nitride film but also the silicon oxide film may be etched as an etching target is micronized. Thus, various defects and pattern abnormalities may occur. Thus, it is necessary to form a protective film on the silicon oxide film to further lower an etching rate of the silicon oxide film.

SUMMARY

One purpose of the present disclosure is to provide an etching solution for a silicon substrate in which an etching selectivity of a silicon nitride film relative to a silicon oxide film may be improved by increasing a concentration of a silane compound (silicon) in the etching solution for the silicon substrate to lower an etching rate of the silicon oxide film.

Further, another purpose of the present disclosure is to provide an etching solution for a silicon substrate that may prevent formation of silicon-based particles or prevent an etching rate of the silicon nitride film from being lowered.

In addition, still another purpose of the present disclosure is to provide a method for manufacturing a semiconductor device, the method including an etching process performed using the etching solution for the silicon substrate as described above.

Purposes of the present disclosure are not limited to the above to mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

In order to achieve the above technical purposes, an aspect of the present disclosure provides an etching solution for a silicon substrate, the solution containing a phosphoric acid aqueous solution and a silicon additive represented by a following Chemical Formula 1:

[Chemical Formula 1]

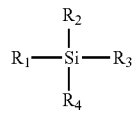

where each of R1 to R4 independently represents one selected from a group consisting of hydrogen, $C_1$-$C_{10}$ alkyl, $C_6$-$C_{12}$ cycloalkyl, $C_2$-$C_{10}$ heteroalkyl containing at least one hetero atom, $C_2$-$C_{10}$ alkenyl, $C_2$-$C_{10}$ alkynyl, $C_1$-$C_{10}$ haloalkyl, $C_1$-$C_{10}$ aminoalkyl, aryl, heteroaryl, aralkyl, hydroxy, amino, halogen, sulfone, phosphonic, phosphoric, thiol, alkoxy, amide, ester, acid anhydride, acyl halide, cyano, carboxyl, and azole, wherein at least one of R1 to R4 is a functional group represented by a following Chemical Formula 2:

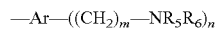 [Chemical Formula 2]

where Ar represents aryl or heteroaryl, m is an integer from 1 to 4, wherein each of R5 and R6 independently represents one selected from a group consisting of hydrogen, $C_1$-$C_{10}$ alkyl, $C_6$-$C_{12}$ cycloalkyl, $C_2$-$C_{10}$ heteroalkyl containing at least one hetero atom, $C_2$-$C_{10}$ alkenyl, $C_2$-$C_{10}$ alkynyl, $C_1$-$C_{10}$ haloalkyl, and $C_1$-$C_{10}$ aminoalkyl, wherein n is an integer from 1 to 5.

According to another aspect of the present disclosure, there is provided a method for manufacturing a semiconductor device, the method including an etching process performed using the etching solution for the silicon substrate as described above.

Effects of the present disclosure are as follows but are not limited thereto.

The silicon additive in the etching solution for the silicon substrate according to the present disclosure may increase a concentration of the silane compound (e.g., silicic acid) under an etching condition of the silicon substrate, thereby to lower the etching rate of the silicon oxide film.

In this connection, the silicon additive in accordance with the present disclosure contains a hydrophilic aryl group or heteroaryl group bonded to a silicon atom to have an sufficient solubility in the etching solution for the silicon substrate.

Further, the aryl group bonded to the silicon atom maintains stable binding with the silicon atom at room temperature, thereby preventing the concentration of the silane compound (silicon) in the etching solution for the silicon substrate from increasing dramatically, thereby to prevent the etching rate of the silicon nitride film from being lowered.

In addition to the effects as described above, specific effects of the present disclosure are described together with specific details for carrying out the invention.

DETAILED DESCRIPTIONS

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an etching solution for a silicon substrate according to the present disclosure will be described in detail.

According to one aspect of the present disclosure, there is provided an etching solution for a silicon substrate, the solution comprising a phosphoric acid aqueous solution and a silicon additive represented by a following Chemical Formula 1:

[Chemical Formula 1]

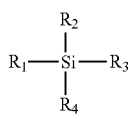

The silicon substrate as an etching target to be subjected to etching using the etching solution for the silicon substrate according to the present disclosure may preferably include at least a silicon oxide film ($SiO_x$). Alternatively, the silicon substrate may include both of the silicon oxide film ($SiO_x$) and a silicon nitride film ($Si_xN_y$). Further, when the silicon substrate includes both the silicon oxide film and the silicon nitride film, the silicon oxide films and the silicon nitride films may be alternately stacked vertically or may be disposed on different regions.

In this connection, depending on a purpose and type of a material of the silicon oxide film, the silicon oxide film may include a SOD (Spin On Dielectric) film, a HDP (High Density Plasma) film, a thermal oxide film, a BPSG (Borophosphate Silicate Glass) film, a PSG (Phospho Silicate Glass) film, a BSG (BoroSilicate Glass) film, a PSZ (Polysilazane) film, a FSG (Fluorinated Silicate Glass) film, a LP-TEOS (Low Pressure TetraEthyl Ortho Silicate) film, a PETEOS (Plasma Enhanced Tetra Ethyl Ortho Silicate) film, a HTO (High Temperature Oxide) film, a MTO (Medium Temperature Oxide) film, an USG (Undoped Silicate Glass) film, a SOG (Spin On Glass) film, an APL (Advanced Planarization Layer) film, an ALD (Atomic Layer Deposition) film, a PE-oxide film (Plasma Enhanced oxide) film or an $O_3$-TEOS ($O_3$-Tetra Ethyl Ortho Silicate) film. However, the present disclosure is not limited thereto.

In this connection, the phosphoric acid aqueous solution acts to etch the silicon nitride film and at the same time, maintain pH of the etching solution to inhibit conversion of various types of silane compounds in the etching solution into silicon-based particles.

In one embodiment, the phosphoric acid aqueous solution is preferably contained in a content of 60 to 90 parts by weight based on 100 parts by weight of the etching solution for the silicon substrate.

When the content of the phosphoric acid aqueous solution is smaller than 60 parts by weight based on 100 parts by weight of the etching solution for the silicon substrate. the etching rate of the silicon nitride film may be lowered, so that the silicon nitride film may not be sufficiently etched or a process efficiency of etching the silicon nitride film may be lowered.

On the contrary, when the content of the phosphoric acid aqueous solution exceeds 90 parts by weight based on 100 parts by weight of the etching solution for the silicon substrate, this may excessively increase the etching rate of the silicon nitride film, and may cause the selectivity of the silicon nitride film relative to the silicon oxide film to be lowered as the silicon oxide film is rapidly etched. Thus, a defect of the silicon substrate may result from the etching of the silicon oxide film.

The etching solution for the silicon substrate according to an embodiment of the present disclosure may contain the silicon additive represented by the following Chemical Formula 1 to increase the selectivity of the silicon nitride film relative to the silicon oxide film:

[Chemical Formula 1]

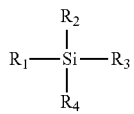

where each of R1 to R4 independently represents one selected from a group consisting of hydrogen, $C_1$-$C_{10}$ alkyl, $C_6$-$C_{12}$ cycloalkyl, $C_2$-$C_{10}$ heteroalkyl containing at least one hetero atom, $C_2$-$C_{10}$ alkenyl, $C_2$-$C_{10}$ alkynyl, $C_1$-$C_{10}$ haloalkyl, $C_1$-$C_{10}$ aminoalkyl, aryl, heteroaryl, aralkyl, and hydrophilic functional groups, wherein at least one of R1 to R4 is a functional group represented by a following Chemical Formula 2:

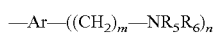 [Chemical Formula 2]

where Ar represents aryl or heteroaryl, wherein m is an integer from 1 to 4, wherein each of R5 and R6 independently represents one selected from a group consisting of hydrogen, $C_1$-$C_{10}$ alkyl, $C_6$-$C_{12}$ cycloalkyl, $C_2$-$C_{10}$ heteroalkyl containing at least one hetero atom, $C_2$-$C_{10}$ alkenyl, $C_2$-$C_{10}$ alkynyl, $C_1$-$C_{10}$ haloalkyl, and $C_1$-$C_{10}$ aminoalkyl, wherein n is an integer from 1 to 5.

As used herein, the term "halogen" means fluoro (—F), chloro (—Cl), bromo (—Br) or iodo (—I). The term "haloalkyl" means alkyl in which at least one hydrogen thereof is substituted with the halogen as described above. For example, halomethyl means methyl (—$CH_2X$, —$CHX_2$ or —$CX_3$) in which at least one of hydrogens of methyl is replaced with the halogen.

Further, as used herein, the term "alkoxy" means both an —O— (alkyl) group and an —O— (unsubstituted cycloalkyl) group, and is a straight- or branched-chain hydrocarbon having at least one ether group and 1 to 10 carbon atoms.

Specifically, the alkoxy may include methoxy, ethoxy, propoxy, isopropoxy, n-butoxy, tert-butoxy, sec-butoxy, n-pentoxy, n-hexoxy, 1,2-dimethylbutoxy, cyclopropyloxy, cyclobutyloxy, cyclopentyloxy, cyclohexyloxy, and the like, but are not limited thereto.

When $R_a$ (a is an integer selected from 1 to 4) is alkenyl or alkynyl, $sp^2$-hybrid carbon of alkenyl or sp-hybrid carbon of alkynyl is directly bonded to silicon, or silicon is indirectly bonded to $sp^2$-hybrid carbon of alkenyl or sp-hybrid carbon of alkynyl via $sp^3$-hybrid carbon of alkyl bonded to the $sp_2$-hybrid carbon of alkenyl or sp-hybrid carbon of alkynyl.

As used herein, a $C_a$-$C_b$ functional group means a functional group having a to b carbon atoms. For example, $C_a$-$C_b$ alkyl means a saturated aliphatic group including straight chain or branched chain alkyl having a to b carbon atoms. The straight or branched alkyl has at most 10 (e.g., $C_1$-$C_{10}$ straight chain or $C_3$-$C_{10}$ branched chain), preferably, up to 4, more preferably, up to 3 carbon atoms in a main chain thereof.

Specifically, alkyl includes methyl, ethyl, n-propyl, i-propyl, n-butyl, s-butyl, i-butyl, t-butyl, pent-1-yl, pent-2-yl, pent-3-yl, 3-methylbut-1-yl, 3-methylbut-2-yl, 2-methylbut-2-yl, 2,2,2-trimethyleth-1-yl, n-hexyl, n-heptyl or n-octyl.

As used herein, the term "aryl" means an unsaturated aromatic ring that includes a single ring or multiple rings (preferably 1 to 4 rings) bonded to each other or connected to each other covalently, unless defined otherwise. Non-limiting examples of aryl include phenyl, biphenyl, o-terphenyl, m-terphenyl, p-terphenyl, 1-naphthyl, 2-naphthyl, 1-anthryl, 2-anthryl, 9-anthryl, 1-phenanthrenyl, 2-phenanthrenyl, 3-phenanthrenyl, 4-phenanthrenyl, 9-phenanthrenyl, 1-pyrenyl, 2-pyrenyl and 4-pyrenyl and the like.

As used herein, the term "aralkyl" refers to a functional group in which aryl is substituted for carbon of alkyl and is a general term of —($CH_2$)—Ar. Examples of aralkyl include benzyl (—$CH_2C_6H_5$) or phenethyl (—$CH_2CH_2C_6H_5$).

As used herein, the term "cycloalkyl" or "heterocycloalkyl containing a hetero atom" refers to a cyclic structure of alkyl or heteroalkyl, respectively, unless defined otherwise.

Non-limiting examples of cycloalkyl include cyclopentyl, cyclohexyl, 1-cyclohexenyl, 3-cyclohexenyl, cycloheptyl and the like.

Non-limiting examples of cycloalkyl containing a hetero atom include 1-(1,2,5,6-tetrahydropyridyl), 1-piperidinyl, 2-piperidinyl, 3-piperidinyl, 4-morpholinyl, 3-morpholinyl, tetrahydrofuran-2-yl, tetrahydrofuran-3-yl, tetrahydrothien-2-yl, tetrahydrothien-3-yl, 1-piperazinyl, and 2-piperazinyl and the like.

Further, cycloalkyl, cycloalkyl containing a hetero atom, aryl or heteroaryl is bonded to or covalently connected to cycloalkyl or cycloalkyl containing a hetero atom.

The hydrophilic functional group bonded to the silicon atom means a hydroxyl group or a functional group which may be substituted with a hydroxyl group under a pH condition of the phosphoric acid aqueous solution.

In this connection, non-limiting examples of the functional group that may be substituted with the hydroxy groups under the pH condition of the phosphoric acid aqueous solution include amino, halogen, sulfone, phosphonic, phosphoric, thiol, alkoxy, amide, ester, acid anhydride, acyl halide, cyano, carboxyl and azole, but are not necessarily limited to the functional groups as described above. It should be understood that the functional group that may be substituted with the hydroxy group under the pH condition of the phosphoric acid aqueous solution may include any functional group that may be substituted with a hydroxyl group under a pH condition of the phosphoric acid aqueous solution.

In this connection, according to one embodiment of the present disclosure, at least one, preferably, at least two of R1 to R4 may be a functional group represented by a following Chemical Formula 2:

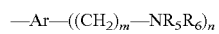
[Chemical Formula 2]

—Ar—(($CH_2$)$_m$—$NR_5R_6$)$_n$

When each of two of R1 to R4 is the functional group represented by the above Chemical Formula 2, the two functional groups may be identical to or different from each other. Further, when each of three of R1 to R4 is the functional group represented by the above Chemical Formula 2, the three functional groups may be identical to or different from each other.

In the functional group represented by the above Chemical Formula 2, Ar is aryl or heteroaryl. Non-limiting examples of aryl and heteroaryl include phenyl, biphenyl, o-terphenyl, m-terphenyl, p-terphenyl, 1-naphthyl, 2-naphthyl, 1-anthryl, 2-anthryl, 9-anthryl, 1-phenanthrenyl, 2-phenanthrenyl, 3-phenanthrenyl, 4-phenanthrenyl, 9-phenanthrenyl, 1-pyrenyl, 2-pyrenyl, 4-pyrenyl, pyridyl, pyridyl, oxazolyl, isooxazolyl, triazolyl, thiazolyl, isothiazolyl, pyrazolyl, pyrazolidinyl, oxadiazolyl, thiadiazolyl, imidazolyl, imidazolinyl, pyridazinyl, triazinyl, piperidinyl, pyrazinyl and pyrimidinyl, etc. but are not necessarily limited thereto.

Unlike alkyl, Ar is bonded to the silicon atom via a $sp^2$ hybrid bond, and thus is relatively easily separated therefrom under an etching condition due to the $sp^2$ hybrid bond rather than a $sp^3$ hybrid bond. Thus, Ar may promote conversion of the silicon additive to the silicic acid. In other words, the silicon additive in the etching solution for the silicon substrate according to the present disclosure may increase a concentration of the silane compound (e.g., silicic acid) under the etching condition of the silicon substrate, thereby to lower the etching rate of the silicon oxide film.

In one example, the $sp^2$ hybrid bond via which Ar is bonded to silicon atoms is stable not under an etching conditions but under a normal storage condition (room temperature). Thus, the bond may not break during the storage to prevent the silicon additive from growing into silicon particles.

In the above Chemical Formula 2, at least one aminoalkyl group may be bonded to aryl or heteroaryl represented by Ar. The number (n) of aminoalkyl groups bonded to aryl or heteroaryl represented by Ar may be in a range of 1 to 5.

Generally, the silane compound in which aryl or heteroaryl is bonded to the silicon atom has low solubility in the etching solution for the silicon substrates, thereby making it difficult to increase the concentration of the silicic acid in the etching solution for the silicon substrate under the etching condition. Thus, sufficient protective effect of the silicon oxide film using the silicon additive may not be achieved.

Therefore, in the silicon additive in the etching solution for the silicon substrate according to the present disclosure, the aryl or heteroaryl group bonded to the silicon atom is replaced with a hydrophilic aminoalkyl group, thereby to ensure sufficient solubility of the silicon additive in the etching solution for the silicon substrate. In particular, a nitrogen atom of the aminoalkyl group may be protonated under an acidic atmosphere of the etching solution for the silicon substrate to further improve the solubility of the silicon additive therein.

Accordingly, the solubility of the silicon additive in accordance with the present disclosure in 85% phosphoric acid aqueous solution at 25° C. and 1 bar may be 100 ppm or greater. As used herein, a unit of the solubility is expressed as ppm. The solubility of the silicon additive present in the etching solution for the silicon substrate may vary depending on a type of a functional group present in the silicon additive.

When the solubility of the silicon additive in the 85% phosphoric acid aqueous solution at 25° C. and 1 bar is lower than 100 ppm, the etching rate of the silicon oxide film may not be sufficiently lowered because the silane compound (silicon) in the etching solution for the silicon substrate is present at an insufficient concentration under the etching condition.

In one example, the aryl group or heteroaryl group bonded to the silicon atom in the silicon additive according to the present disclosure is removed from the silicon atom under the etching condition (for example, lower than or equal to pH 3 and higher than or equal to 150° C.). As a result, the silicon additive is converted into a silane compound such as silicic acid, which may impart a passivation effect on the silicon oxide film. Further, arene or heteroarene removed from the silicon atom may be evaporated from the etching solution for the silicon substrate the under etching condition.

In other words, the silicon additive in the etching solution for the silicon substrate according to the present disclosure increases the concentration of the silane compound (e.g., silicic acid) under the etching condition of the silicon substrate, thereby to lower the etching rate of the silicon oxide film.

In this connection, the functional group represented by the above Chemical Formula 2 and bonded to the silicon atom may maintain a stable bond with the silicon atom at room temperature, thereby to prevent sharp increase in the concentration of the silane compound (silicon) in the etching solution for the silicon substrate. Thus, the etching rate of the silicon nitride film may not be lowered.

In addition, the functional group represented by the above Chemical Formula 2 and bonded to the silicon atom is removed from the silicon atom only under the etching condition of the silicon substrate using the etching solution for the silicon substrate. Thus, during storage of the etching solution for the silicon substrate at room temperature, formation of silicon-based particles due to the rapidly increased silane compound (e.g., silicic acid) in the etching solution for the silicon substrate may be suppressed.

In one example, the number (m) of carbon atoms contained in an alkyl group between aryl or heteroaryl and an amino group may be in a range of 1 to 4.

When the amino group is directly linked to aryl or heteroaryl (that is, m is 0), an electron density of the aryl or heteroaryl may increase as an unshared electron pair of the amino group is shared with aryl or heteroaryl. In this case, aryl or heteroaryl which is relatively electron-rich under the storage condition of the etching solution for the silicon substrate (at room temperature) is easily separated from the silicon atom, thereby to allow the silicon additive to grow into silicon particles.

To the contrary, when the number (m) of carbon atoms in the alkyl group between aryl or heteroaryl and the amino groups is excessively large (e.g., 5 or greater), a distance between the amino group and the aryl or heteroaryl is relatively large. Thus, electron attraction effect of the nitrogen atom on aryl or heteroaryl is insufficient, and thus effect of promoting breaking of the $sp^2$ hybrid bond under the etching condition may be insufficient.

Each of R5 and R6 bonded to the nitrogen atom of the aminoalkyl group bonded to a terminal of the aryl or heteroaryl group independently represents one selected from a group consisting of hydrogen, $C_1$-$C_{10}$ alkyl, $C_6$-$C_{12}$ cycloalkyl, $C_2$-$C_{10}$ heteroalkyl containing at least one hetero atom, $C_2$-$C_{10}$ alkenyl, $C_2$-$C_{10}$ alkynyl, $C_1$-$C_{10}$ haloalkyl, and $C_1$-$C_{10}$ aminoalkyl.

The silicon additive as described above is preferably present at 100 to 10,000 ppm in the etching solution for the silicon substrate. In this connection, a content of the silicon additive refers to an amount of the silicon additive dissolved in the etching solution for the silicon substrate, and is expressed in ppm. For example, presence of 100 ppm of the silicon additive in the etching solution for the silicon substrate may mean that an amount of the silicon additive dissolved in the etching solution for the silicon substrate is 100 ppm.

When the content of the silicon additive in the etching solution for the silicon substrate is lower than 100 ppm, an amount of the silane compound removed and released from the silicon additive under the etching condition may be excessively small, such that increase in the selectivity of the silicon nitride film relative to the silicon oxide film may be small.

On the contrary, when the content of the silicon additive in the etching solution for the silicon substrate exceeds 10,000 ppm, an amount of the silane compound removed and released from the silicon additive under the etching condition may be excessively large. Thus, the etching rate of the silicon nitride film may be lowered. Further, the silane compound in the etching solution may act as a source of silicon-based particles on its own.

The etching solution for the silicon substrate according to an embodiment of the present disclosure may further contain a fluorine-containing compound to improve efficiency of an overall etching process while compensating for the etching rate of the silicon nitride film as lowered due to the silicon additive.

As used herein, the fluorine-containing compound refers to any type of a compound capable of dissociating fluorine ions.

In one embodiment, the fluorine-containing compound may be at least one selected from hydrogen fluoride, ammonium fluoride, ammonium bifluoride, and ammonium hydrogen fluoride.

Further, in another embodiment, the fluorine-containing compound may be a compound in which organic based cation and fluorine based anion are ion-bonded with each other.

For example, the fluorine-containing compound may be a compound in which alkylammonium and fluorine based anion are ion-bonded with each other. In this connection, alkylammonium refers to ammonium having at least one alkyl group and may have up to four alkyl groups. A definition of the alkyl group has been described above.

In another example, the fluorine-containing compound may be a compound in which organic based cation selected from alkylpyrrolium, alkylimidazolium, alkylpyrazolium, alkyloxazolium, alkylthiazolium, alkylpyridinium, alkylpyrimidinium, alkylpyridazinium, alkylpyrazinium, alkylpyrrolidinium, alkylphosphonium, alkylmorpholinium and alkylpiperidinium are ion-bonded with fluorine based anion selected from fluorophosphate, fluoroalkyl-fluorophosphate, fluoroborate, and fluoroalkyl-fluoroborate.

The fluorine-containing compound provided in an ionic liquid form may have a higher boiling point and decomposition temperature compared to hydrogen fluoride or ammonium fluoride commonly used as the fluorine-containing compound in an etching solution for a silicon substrate. Thus, there is an advantage that as the fluorine-containing compound provided in an ionic liquid form is decomposed during the etching process performed at a high temperature, there is little concern about changing the composition of the etching solution.

According to another aspect of the present disclosure, a method for manufacturing a semiconductor device, the method including an etching process performed using the etching solution for the silicon substrate as described above is provided.

According to the present manufacturing method, a semiconductor device may be manufactured by performing a selective etching process on a silicon substrate containing at least a silicon nitride film ($Si_xN_y$) using the above-described etching solution to selectively etch the silicon nitride film ($Si_xN_y$).

The silicon substrate used in the manufacture of the semiconductor device may preferably include at least a silicon nitride film ($Si_xN_y$). Alternatively, the silicon substrate may include both of a silicon oxide film ($SiO_x$) and a silicon nitride film ($Si_xN_y$). Further, when the silicon substrate includes both the silicon oxide film and the silicon nitride film, the silicon oxide films and the silicon nitride films may be alternately stacked vertically or may be disposed on different regions.

The method for manufacturing the semiconductor device in accordance with the present disclosure may be performed using the etching solution for the silicon substrate as described above in a process step where selective removal of the silicon nitride film without loss of the silicon oxide film is required, during a device isolation process for a flash memory device, a device isolation process for a DRAM device or a diode formation process for a phase change memory device.

Hereinafter, specific examples of the present disclosure will be presented. However, the experiments as described below are merely to specifically illustrate or explain the present disclosure and should not limit the present disclosure.

Composition of Etching Solution for Silicon Substrate

Present Example 1

An etching solution for a silicon substrate was prepared by mixing phosphoric acid 85 wt %, silicon additive 1,000 ppm represented by a following Chemical Formula 3, and water as remainder:

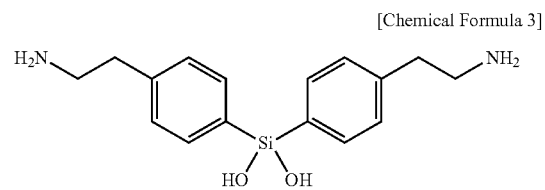 [SMILES: NCCc1ccc([Si](O)(O)c2ccc(CCN)cc2)cc1]

[Chemical Formula 3]

Present Example 2

An etching solution for a silicon substrate was prepared in the same manner as in Present Example 1 except that silicon additive represented by a following Chemical Formula 4 was used:

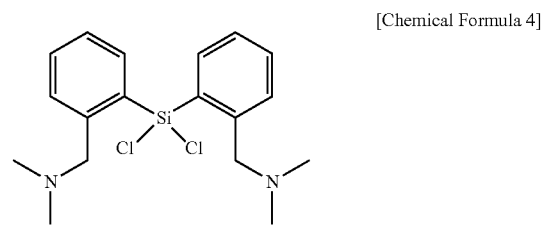

[Chemical Formula 4]

Present Example 3

An etching solution for a silicon substrate was prepared in the same manner as in Present Example 1 except that silicon additive represented by a following Chemical Formula 5 was used:

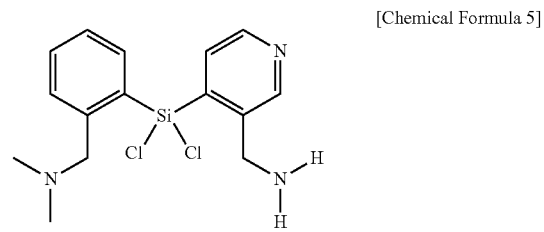 [SMILES: CN(C)Cc1ccccc1[Si](Cl)(Cl)c1ccncc1CN]

[Chemical Formula 5]

Comparative Example 1

An etching solution for a silicon substrate was prepared in the same manner as in Present Example 1 except that no silicon additive was used.

Comparative Example 2

An etching solution for a silicon substrate was prepared in the same manner as in Present Example 1 except that silicon additive represented by a following Chemical Formula 6 was used:

[Chemical Formula 6]

Comparative Example 3

An etching solution for a silicon substrate was prepared in the same manner as in Present Example 1, except that silicon additive represented by a following Chemical Formula 7 was used:

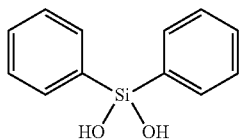

[Chemical Formula 7]

Experimental Example 1

In order to identify the solubility of the silicon additive in the etching solution for the silicon substrate having a composition according to each of Present Examples and Comparative Examples, the solubility of the silicon additive was measured using ICP at 25° C. and 1 bar. The measurement results are shown in Table 1 below.

TABLE 1

| Examples | Content of silicon additive dissolved in etching solution (ppm) |
|---|---|
| Present Example 1 | 996 |
| Present Example 2 | 988 |
| Present Example 3 | 986 |
| Comparative Example 1 | — |
| Comparative Example 2 | 1000 |
| Comparative Example 3 | 30 |

Referring to the results of Table 1, unlike the silicon additive used in Comparative Example 3, in the silicon additive used in each of Present Examples 1 to 3, a hydrophilic aminoalkyl group is substituted to an aryl group or heteroaryl group bonded to a silicon atom, thereby ensuring the sufficient solubility of the silicon additive in the etching solution for the silicon substrate. This may increase the concentration of the silane compound (silicon) in the etching solution for the silicon substrate to lower the etching rate of the silicon oxide film.

Experimental Example 2

After heating the etching solution for the silicon substrate having the composition according to each of Present Examples and Comparative Examples to 165° C., a 500 Å thick silicon oxide film and a 500 Å thick silicon nitride film were immersed, for 3 minutes, in the heated etching solution and thus was etched. In this connection, pH of the etching solution heated to 165° C. was within a range of 2.0 to 2.5.

A thicknesses of each of the silicon oxide film and the silicon nitride film before the etching and after the etching was measured using an ellipsometry (Nano-View, SE MG-1000). A measurement result is an average value of five measurement results. The etching rate refers to a value obtained by dividing a difference between a thickness of each of the silicon oxide film and the silicon nitride before the etching and a thickness thereof after the etching by a etching time (3 minutes).

Further, after the etching, the etching solution was analyzed using a particle size analyzer to measure an average diameter of each of silicon-based particles in the etching solution.

The measured etching rate and the average diameter of each of silicon-based particles in the etching solution are shown in Table 2 below.

TABLE 2

| Examples | Average diameter of silicon-based particle (μm) | Etching rate of silicon oxide film (Å/min) | Etching rate of silicon nitride film (Å/min) |
|---|---|---|---|
| Present Example 1 | <0.01 | 0.52 | 92.55 |
| Present Example 2 | <0.01 | 0.08 | 89.58 |
| Present Example 3 | <0.01 | 0.35 | 91.98 |
| Comparative Example 1 | — | 5.79 | 92.19 |
| Comparative Example 2 | 3.0> | 2.79 | 91.03 |
| Comparative Example 3 | <0.01 | 5.30 | 91.89 |

Referring to the results of Table 2, when compared with an example without using a separate silicon additive, such as Comparative Example 1, the etching rate of the silicon oxide film may be lowered using the silane compound to increase the silicon concentration in the etching solution as the silicon additive as in Comparative Example 2. As a result, using the silicon additive may improve the etching selectivity of the silicon nitride film relative to the silicon oxide film.

However, it may be seen that when using a silane compound having an ethoxy group bonded to a silicon atom as the silicon additive as in Comparative Example 2, the silicon-based particles grow.

It may be seen that the silicon additive used in Comparative Example 3 may not be sufficiently dissolved in the etching solution for the silicon substrate, and, thus, the effect of improving the etching selectivity of the silicon nitride film is insignificant.

Experimental Example 3

After the etching solution for the silicon substrate having the composition according to each of Present Examples and Comparative Examples was heated at 165° C. for 0.5 hours, 1 hour and 2 hours, respectively. Then, a 500 Å thick silicon oxide film and a 500 Å thick silicon nitride film were immersed and etched, for 3 minutes, in the heated etching solution. In this connection, pH of the etching solution heated to 165° C. was within a range of 2.0 to 2.5.

A thicknesses of each of the silicon oxide film and the silicon nitride film before the etching and after the etching was measured using an ellipsometry (Nano-View, SE MG-1000). A measurement result is an average value of five measurement results. The etching rate refers to a value obtained by dividing a difference between a thickness of each of the silicon oxide film and the silicon nitride before the etching and a thickness thereof after the etching by a etching time (3 minutes).

Etching rates measured using the etching solutions for the silicon substrate at varying heating times are shown in Tables 3 to 5 below.

TABLE 3

| Heating for 0.5 hour | Etching rate of silicon oxide film (Å/min) | Etching rate of silicon nitride film (Å/min) |
|---|---|---|
| Present Example 1 | 0.46 | 92.20 |
| Present Example 2 | 0.10 | 90.19 |
| Present Example 3 | 0.42 | 93.10 |

TABLE 3-continued

| Heating for 0.5 hour | Etching rate of silicon oxide film (Å/min) | Etching rate of silicon nitride film (Å/min) |
|---|---|---|
| Comparative Example 1 | 5.79 | 92.72 |
| Comparative Example 2 | 1.87 | 91.00 |
| Comparative Example 3 | 4.64 | 94.05 |

TABLE 4

| Heating for 1 hour | Etching rate of silicon oxide film (Å/min) | Etching rate of silicon nitride film (Å/min) |
|---|---|---|
| Present Example 1 | 0.45 | 92.21 |
| Present Example 2 | 0.08 | 90.18 |
| Present Example 3 | 0.40 | 93.07 |
| Comparative Example 1 | 5.87 | 92.55 |
| Comparative Example 2 | 1.29 | 91.11 |
| Comparative Example 3 | 3.72 | 94.07 |

TABLE 5

| Heating for 2 hours | Etching rate of silicon oxide film (Å/min) | Etching rate of silicon nitride film (Å/min) |
|---|---|---|
| Present Example 1 | 0.39 | 92.20 |
| Present Example 2 | 0.08 | 90.20 |
| Present Example 3 | 0.39 | 93.10 |
| Comparative Example 1 | 5.79 | 92.72 |
| Comparative Example 2 | 0.82 | 91.00 |
| Comparative Example 3 | 3.56 | 94.05 |

As the heating time of the etching solution for the silicon substrate increases, a content of the silane compound (silicic acid) in the etching solution for the silicon substrate gradually increases. Accordingly, the etching rate of the silicon oxide film is gradually reduced, and the etching selectivity of the silicon nitride film relative to the silicon oxide film is improved.

It is to be understood that the aforementioned embodiments are illustrative in all respects and not restrictive. Further, the scope of the present disclosure will be indicated by the following claims rather than the aforementioned description. Further, the meaning and scope of the claims to be described later, as well as all changes and modifications derived from the equivalent concept should be construed as being included in the scope of the present disclosure.

What is claimed is:

1. An etching solution for a silicon substrate, the etching solution containing:

a phosphoric acid aqueous solution; and a silicon additive represented by a following Chemical Formula 1:

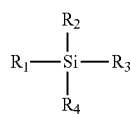

[Chemical Formula 1]

where each of R1 to R4 independently represents one selected from a group consisting of hydrogen, $C_1$-$C_{10}$ alkyl, $C_6$-$C_{12}$ cycloalkyl, $C_2$-$C_{10}$ heteroalkyl containing at least one hetero atom, $C_2$-$C_{10}$ alkenyl, $C_2$-$C_{10}$ alkynyl, $C_1$-$C_{10}$ haloalkyl, $C_1$-$C_{10}$ aminoalkyl, aryl, heteroaryl, aralkyl, hydroxy, amino, halogen, sulfone, phosphonic, phosphoric, thiol, alkoxy, amide, ester, acid anhydride, acyl halide, cyano, carboxyl, and azole, wherein at least one of R1 to R4 is a functional group represented by a following Chemical Formula 2:

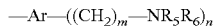 [Chemical Formula 2]

where Ar represents aryl or heteroaryl, wherein m is an integer from 1 to 4, wherein each of R5 and R6 independently represents one selected from a group consisting of hydrogen, $C_1$-$C_{10}$ alkyl, $C_6$-$C_{12}$ cycloalkyl, $C_2$-$C_{10}$ heteroalkyl containing at least one hetero atom, $C_2$-$C_{10}$ alkenyl, $C_2$-$C_{10}$ alkynyl, $C_1$-$C_{10}$ haloalkyl, and $C_1$-$C_{10}$ aminoalkyl, wherein n is an integer from 1 to 5.

2. The etching solution of claim 1, wherein Ar is selected from a group consisting of phenyl, biphenyl, terphenyl, naphthyl, anthryl, phenanthrenyl, and pyrenyl.

3. The etching solution of claim 1, wherein Ar is selected from a group consisting of pyrrolyl, pyridyl, oxazolyl, isooxazolyl, triazolyl, thiazolyl, isothiazolyl, pyrazolyl, pyrazolidinyl, oxadiazolyl, thiadiazolyl, imidazolyl, imidazolinyl, pyridazinyl, triazinyl, piperidinyl, pyrazinyl, and pyrimidinyl.

4. The etching solution of claim 1, wherein each of two of R1 to R4 is a functional group represented by the Chemical Formula 2, wherein the two functional groups are the same as or different from each other.

5. The etching solution of claim 1, wherein each of three of R1 to R4 is a functional group represented by the Chemical Formula 2, wherein the three functional groups are the same as or different from each other.

6. The etching solution of claim 1, wherein a content of the silicon additive in the etching solution for the silicon substrate is in a range of 100 to 10,000 ppm.

7. The etching solution of claim 1, wherein the etching solution for the silicon substrate etches a single film including only a silicon oxide film or etches a multi-layer film including both of a silicon oxide film and a silicon nitride film.

8. The etching solution of claim 1, wherein the etching solution for the silicon substrate further contains at least one fluorine-containing compound selected from a group consisting of hydrogen fluoride, ammonium fluoride, ammonium bifluoride, and ammonium hydrogen fluoride.

9. The etching solution of claim 1, wherein the etching solution for the silicon substrate further contains a fluorine-containing compound in which organic based cation and fluorine based anion are ion-bonded with each other.

10. A method for manufacturing a semiconductor device, the method comprising an etching process performed using the etching composition of claim 1.

* * * * *